(12) United States Patent
Hirao et al.

(10) Patent No.: US 11,611,017 B2
(45) Date of Patent: *Mar. 21, 2023

(54) GROUP 13 ELEMENT NITRIDE LAYER, FREE-STANDING SUBSTRATE AND FUNCTIONAL ELEMENT

(71) Applicant: NGK INSULATORS, LTD., Nagoya (JP)

(72) Inventors: Takayuki Hirao, Nisshin (JP); Hirokazu Nakanishi, Nagoya (JP); Mikiya Ichimura, Ichinomiya (JP); Takanao Shimodaira, Nagoya (JP); Masahiro Sakai, Nagoya (JP); Takashi Yoshino, Ama (JP)

(73) Assignee: NGK INSULATORS, LTD., Nagoya (JP)

(*) Notice: Subject to any disclaimer, the term of this patent is extended or adjusted under 35 U.S.C. 154(b) by 505 days.

This patent is subject to a terminal disclaimer.

(21) Appl. No.: 16/797,685

(22) Filed: Feb. 21, 2020

(65) Prior Publication Data

US 2020/0194621 A1 Jun. 18, 2020

Related U.S. Application Data

(63) Continuation of application No. PCT/JP2018/028206, filed on Jul. 27, 2018.

(30) Foreign Application Priority Data

Aug. 24, 2017 (WO) .................. PCT/JP2017/030373
Sep. 21, 2017 (WO) .................. PCT/JP2017/034035
Mar. 28, 2018 (JP) ............................ JP2018-061580

(51) Int. Cl.
*H01L 29/04* (2006.01)
*H01L 33/18* (2010.01)
(Continued)

(52) U.S. Cl.
CPC ............ *H01L 33/18* (2013.01); *H01L 29/045* (2013.01); *H01L 29/2003* (2013.01);
(Continued)

(58) Field of Classification Search
CPC ... H01L 33/18; H01L 29/045; H01L 29/2003; H01L 29/34; H01L 29/7786; H01L 29/872; H01L 33/025; H01L 33/06; H01L 33/32
See application file for complete search history.

(56) References Cited

U.S. PATENT DOCUMENTS 11,011,678 B2 * 5/2021 Hirao ...................... C30B 29/38
11,088,299 B2 * 8/2021 Hirao .................... C30B 29/406
(Continued)

FOREIGN PATENT DOCUMENTS

JP 2000277803 A 10/2000
JP 2001284736 A 10/2001
(Continued)

OTHER PUBLICATIONS

English language International Preliminary Report on Patentability and Written Opinion of the International Searching Authority, issued in corresponding International Application No. PCT/JP2018/028206, dated Oct. 9, 2018 (11 pages).
(Continued)

*Primary Examiner* — Samuel A Gebremariam
(74) *Attorney, Agent, or Firm* — Flynn Thiel, P.C.

(57) ABSTRACT

A layer of a crystal of a group 13 nitride selected from gallium nitride, aluminum nitride, indium nitride and the mixed crystals thereof has an upper surface and a bottom surface. The upper surface of a crystal layer of the group 13 nitride includes a linear high-luminance light-emitting part and a low-luminance light-emitting region adjacent to the high-luminance light-emitting part, observed by cathode
(Continued)

luminescence. The high-luminance light-emitting part includes a portion extending along an m-plane of the crystal of the group 13 nitride. The crystal of the nitride of the group 13 element contains oxygen atoms in a content of $1\times10^{18}$ atom/cm$^3$ or less, silicon atoms, manganese atoms, carbon atoms, magnesium atoms and calcium atoms in contents of $1\times10^{17}$ atom/cm$^3$ or less, chromium atoms in a content of $1\times10^{16}$ atom/cm$^3$ or less and chlorine atoms in a content of $1\times10^{15}$ atom/cm$^3$ or less.

14 Claims, 10 Drawing Sheets

(51) Int. Cl.
| | |
|---|---|
| *H01L 29/20* | (2006.01) |
| *H01L 29/34* | (2006.01) |
| *H01L 29/778* | (2006.01) |
| *H01L 29/872* | (2006.01) |
| *H01L 33/02* | (2010.01) |
| *H01L 33/06* | (2010.01) |
| *H01L 33/32* | (2010.01) |

(52) U.S. Cl.
CPC .......... *H01L 29/34* (2013.01); *H01L 29/7786* (2013.01); *H01L 29/872* (2013.01); *H01L 33/025* (2013.01); *H01L 33/06* (2013.01); *H01L 33/32* (2013.01)

(56) References Cited

U.S. PATENT DOCUMENTS

| | | | |
|---|---|---|---|
| 11,309,455 B2* | 4/2022 | Hirao | ..................... C30B 9/10 |
| 2005/0098090 A1 | 5/2005 | Hirota et al. | |
| 2006/0170000 A1 | 8/2006 | Oshima | |
| 2009/0081857 A1 | 3/2009 | Hanser et al. | |
| 2010/0102360 A1 | 4/2010 | Nakada et al. | |
| 2011/0287222 A1 | 11/2011 | Hirao et al. | |
| 2012/0175740 A1 | 7/2012 | Hirao et al. | |
| 2015/0144956 A1 | 5/2015 | Watanabe et al. | |
| 2015/0357521 A1 | 12/2015 | Choe | |
| 2016/0020284 A1 | 1/2016 | D'Evelyn et al. | |
| 2016/0049554 A1 | 2/2016 | Iwai et al. | |
| 2016/0233380 A1 | 8/2016 | Ichimura et al. | |
| 2016/0254411 A1 | 9/2016 | Fukuyama et al. | |
| 2017/0330749 A1 | 11/2017 | Yoshino et al. | |
| 2018/0038010 A1 | 2/2018 | Mori et al. | |
| 2018/0247809 A1 | 8/2018 | Ichimura et al. | |
| 2018/0291525 A1 | 10/2018 | Kimura et al. | |
| 2020/0232120 A1 | 7/2020 | Hirao et al. | |

FOREIGN PATENT DOCUMENTS

| | | | |
|---|---|---|---|
| JP | 2005154254 A | | 6/2005 |
| JP | 2005203418 A | | 7/2005 |
| JP | 2009147271 A | | 7/2009 |
| JP | 2010168273 A | | 8/2010 |
| JP | 2010180111 A | | 8/2010 |
| JP | 5770905 B1 | | 8/2015 |
| JP | 201612717 A | | 1/2016 |
| JP | 5897790 B2 | | 3/2016 |
| JP | 2016160151 A | | 9/2016 |
| JP | 2016188172 A | | 11/2016 |
| JP | 201752660 A | | 3/2017 |
| JP | 6154066 B2 | | 6/2017 |
| WO | 2010084682 A1 | | 7/2010 |
| WO | 2011046203 A1 | | 4/2011 |
| WO | 2015068458 A1 | | 5/2015 |
| WO | 2016121853 A1 | | 8/2016 |
| WO | 2017077989 A1 | | 5/2017 |

OTHER PUBLICATIONS

International Search Report issued in corresponding International Application No. PCT/JP2017/034035 with transmittal, dated Nov. 28, 2017 (5 pages).
International Preliminary Report on Patentability and Written Opinion of the International Searching Authority with English translation, issued in corresponding International Application No. PCT/JP2017/034035, dated Nov. 28, 2017 (10 pages).
Co-pending U.S. Appl. No. 16/797,581, filed Feb. 21, 2020.
Co-pending U.S. Appl. No. 16/797,961, filed Feb. 21, 2020.
Co-pending U.S. Appl. No. 16/797,791, filed Feb. 21, 2020.
Co-pending U.S. Appl. No. 16/797,505, filed Feb. 21, 2020.
International Search Report issued in corresponding International Application No. PCT/JP2018/028206 with English translation dated Oct. 9, 2018 (5 pages).
Written Opinion of International Searching Authority issued in corresponding International Application No. PCT/JP2018/028206 dated Oct. 9, 2018 (7 pages).
English Decision to Grant a Patent for JP 66397526 (Application No. 2019-537547) (3 pages).
Chinese Office Action with English Translation issued in corresponding Chinese Application No. 201780093870.X, dated Jul. 2, 2020 (15 pages).

* cited by examiner

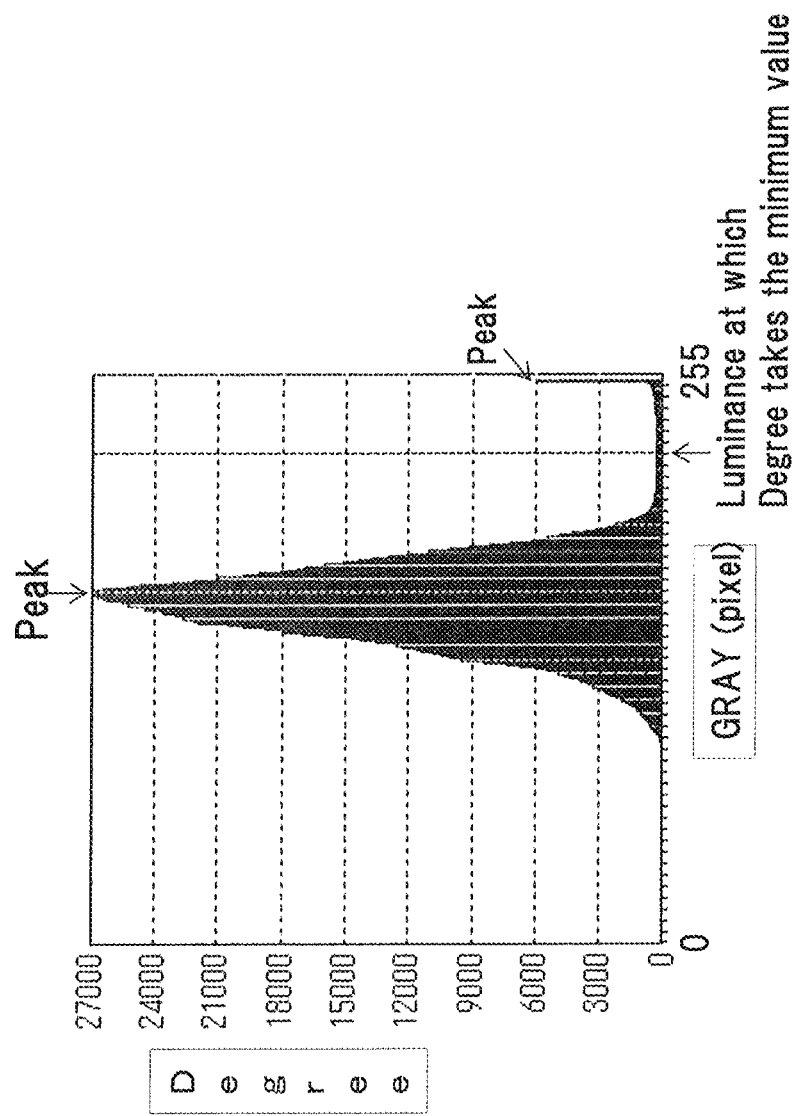

GROUP 13 ELEMENT NITRIDE LAYER, FREE-STANDING SUBSTRATE AND FUNCTIONAL ELEMENT

CROSS-REFERENCE TO RELATED APPLICATIONS

This is a continuation of PCT/JP2018/028206, filed Jul. 27, 2018, which claims priority to PCT/JP2017/030373, filed Aug. 24, 2017, and PCT/JP2017/034035, filed Sep. 21, 2017, which claims priority to Japanese Application No. 2018-061580, filed Mar. 28, 2018, the entire contents of which are incorporated herein by reference.

TECHNICAL FIELD

The present invention relates to a layer of a nitride of a group 13 element, a free-standing substrate and a functional device.

BACKGROUND ARTS

Light emitting devices such as light emitting diodes (LEDs) that use sapphire (α-alumina single crystal) as a monocrystalline substrate, with various types of gallium nitride (GaN) layers formed thereon are known. For example, light emitting devices have been mass-produced having a structure in which an n-type GaN layer, a multiple quantum well (MQW) layer with an InGaN quantum well layer and a GaN barrier layer laminated alternately therein and a p-type GaN layer are formed in a laminated manner in this order on a sapphire substrate.

Patent document 1 describes a gallium nitride layer composed of polycrystalline gallium nitride having many gallium nitride monocrystalline grains, including many columnar gallium nitride monocrystalline grains laterally arranged.

Patent document 2 describes a gallium nitride layer composed of polycrystalline gallium nitride having many gallium nitride monocrystalline grains, including many columnar gallium nitride monocrystalline grains laterally arranged. Further, an average tilt angle on a surface (an average value of inclination of crystal orientation (crystalline axis) with respect to a normal line of the surface) is 1° to 10°.

According to patent document 3, inclusions are contained at a high concentration from a bottom surface to an intermediate position, and between the intermediate position and the upper surface, a plurality of grain boundaries having a low concentration of the inclusions are formed from the bottom surface in a diagonal direction. Further, the grain boundaries are elongated in the diagonal direction at an angle of 50 to 70° with respect to c-axis.

Patent document 5 describes gallium nitride crystals having a low dislocation density by increasing a ratio of Ga in a melt.

RELATED ART DOCUMENTS

Patent Documents (Patent document 1) Japanese Patent No. 5770905B
(Patent document 2) Japanese Patent No. 6154066B
(Patent document 3) Japanese Patent No. 5897790B
(Patent document 4) WO 2011/046203 A1
(Patent document 5) WO 2010/084682 A1

SUMMARY OF THE INVENTION

When a light-emitting device is produced on the gallium nitride crystal of patent document 1 or 2, it was shown that a current path may be interrupted resulting in a reduction of luminance efficiency, although it is dependent on balance between a size of the device and grain size. Although the reasons are not clear, an anisotropic property of the orientations of the monocrystalline grains may affect the reduction.

According to gallium nitride crystals of patent documents 3 and 4, as their size is made larger, it maybe difficult to control the flow of the melt over the whole surface of a substrate so that voids may be left on the peripheral part of the crystal.

According to patent document 5, although it is possible to reduce the dislocation density by applying a high Ga ratio and by controlling the flow of the flux to increase the grain size, voids tend to be included between the grains.

An object of the present invention is, in a layer of a crystal of a group 13 nitride having an upper surface and lower surface and composed of a crystal of the group 13 nitride selected from gallium nitride, aluminum nitride, indium nitride or the mixed crystals thereof, to provide microstructure capable of reducing a dislocation density and reducing the deviation of a property as a whole.

The present invention provides a layer of a crystal of a nitride of a group 13 element, said crystal of said nitride being selected from gallium nitride, aluminum nitride, indium nitride and the mixed crystals thereof and said layer comprising an upper surface and a bottom surface:

wherein said upper surface comprises a linear high-luminance light-emitting part and a low-luminance light-emitting region adjacent to said high-luminance light-emitting part, and wherein said high-luminance light-emitting part comprises a portion extending along an m-plane of said crystal of said nitride of said group 13 element, said upper surface being observed by cathode luminescence; and wherein said crystal of said nitride of said group 13 element comprises oxygen atoms in a content of $1\times10^{18}$ atom/cm$^3$ or less, silicon atoms, manganese atoms, carbon atoms, magnesium atoms and calcium atoms in contents of $1\times10^{17}$ atom/cm$^3$ or less, chromium atoms in a content of $1\times10^{16}$ atom/cm$^3$ or less and chlorine atoms in a content of $1\times10^{15}$ atom/cm$^3$ or less.

The present invention further provides a free-standing substrate comprising the layer of the nitride of said group 13 element.

The present invention further provides a composite substrate comprising:
a supporting body; and
the layer of the nitride of the group 13 element provided on the supporting body.

The present invention further provides a functional device comprising:
the free-standing substrate; and
a functional layer provided on the layer of the nitride of the group 13 element.

The present invention further provides a functional device comprising:
the composite substrate; and
a functional layer provided on the layer of the nitride of the group 13 element.

According to the present invention, in the case that the upper surface of the layer of the crystal of the nitride of the group 13 element is observed by cathode luminescence, the layer includes the linear high-luminance light-emitting part and the low-luminance light-emitting region adjacent to the high-luminance light-emitting part, and the high-luminance light-emitting part includes a portion extending along the m-plane of the crystal of the group 13 nitride. The linear high-luminance light-emitting part appears on the upper surface, indicating that dopant and minute components and the like contained in the crystal of the group 13 nitride form the thick high-luminance light-emitting part. At the same time, the linear high-luminance light-emitting part extends along the m-plane, indicating that dopants are concentrated along the m-plane during the crystal growth and that the thick linear high-luminance light-emitting part appears along the m-plane.

According to the layer of the crystal of the group 13 nitride having the novel microstructure, it is possible to provide the layer of the crystal of the group 13 nitride in which the dislocation density can be made lower and the deviation of a property can be reduced as a whole, even in the case of a larger size (for example, when the diameter is 6 inches or larger).

In addition to this, when oxygen atoms, silicon atoms, manganese atoms, carbon atoms, magnesium atoms, calcium atoms, chromium atoms and chlorine atoms are contained in large quantities, these atoms have the effect of concentrating and localizing the high-luminance part. By suppressing the contents of the atoms to minute quantities as described above, the high-luminance light-emitting part along the m-plane tends to generate uniformly over the whole surface, so that it is possible to further suppress the deviation of a property of the functional layer formed thereon.

BRIEF DESCRIPTION OF DRAWINGS

FIG. 10 shows a histogram of a gray scale generated from the CL image.

EMBODIMENTS FOR CARRYING OUT THE INVENTION

The present invention will be described further in detail.
(Layer of Crystal of Group 13 Nitride)
A layer of a crystal of a group 13 nitride of the present invention is composed of a crystal of a group 13 nitride selected from gallium nitride, aluminum nitride, indium nitride and the mixed crystals thereof, and includes an upper surface or lower surface. For example, as shown in FIG. 1 (b), the upper surface 13a and bottom surface 13b of the layer 13 of the crystal of the group 13 nitride are opposed to each other.

The nitride forming the layer of the crystal of the group 13 nitride includes gallium nitride, aluminum nitride, indium nitride or the mixed crystal thereof, preferably GaN, AlN, InN, $Ga_xAl_{1-x}N$ (1>x>0), $Ga_xIn_{1-x}N$ (1>x>0) and $Ga_xAl_yIn_zN$ (1>x>0, 1>y>0, x+y+z=1).

More preferably, the nitride forming the layer of the crystal of the group 13 nitride is a gallium nitride series nitride such as GaN, $Ga_xAl_{1-x}N$ (1>x>0.5), $Ga_xIn_{1-x}N$ (1>x>0.4) or $Ga_xAl_yIn_zN$ (1>x>0.5, 1>y>0.3, x+y+z=1).

The nitride of the group 13 element may be doped with zinc, calcium or the other n-type dopant or p-type dopant, and in this case, the polycrystalline group 13 nitride can be used as a member or a layer other than the base material, such as a p-type electrode, an n-type electrode, a p-type layer, or an n-type layer. A preferable example of a p-type dopant may be one or more selected from the group consisting of beryllium (Be), magnesium (Mg), strontium (Sr), and cadmium (Cd). A preferable example of an n-type dopant may be one or more selected from the group consisting of silicon (Si), germanium (Ge), tin (Sn), and oxygen (O).

Figure 2:
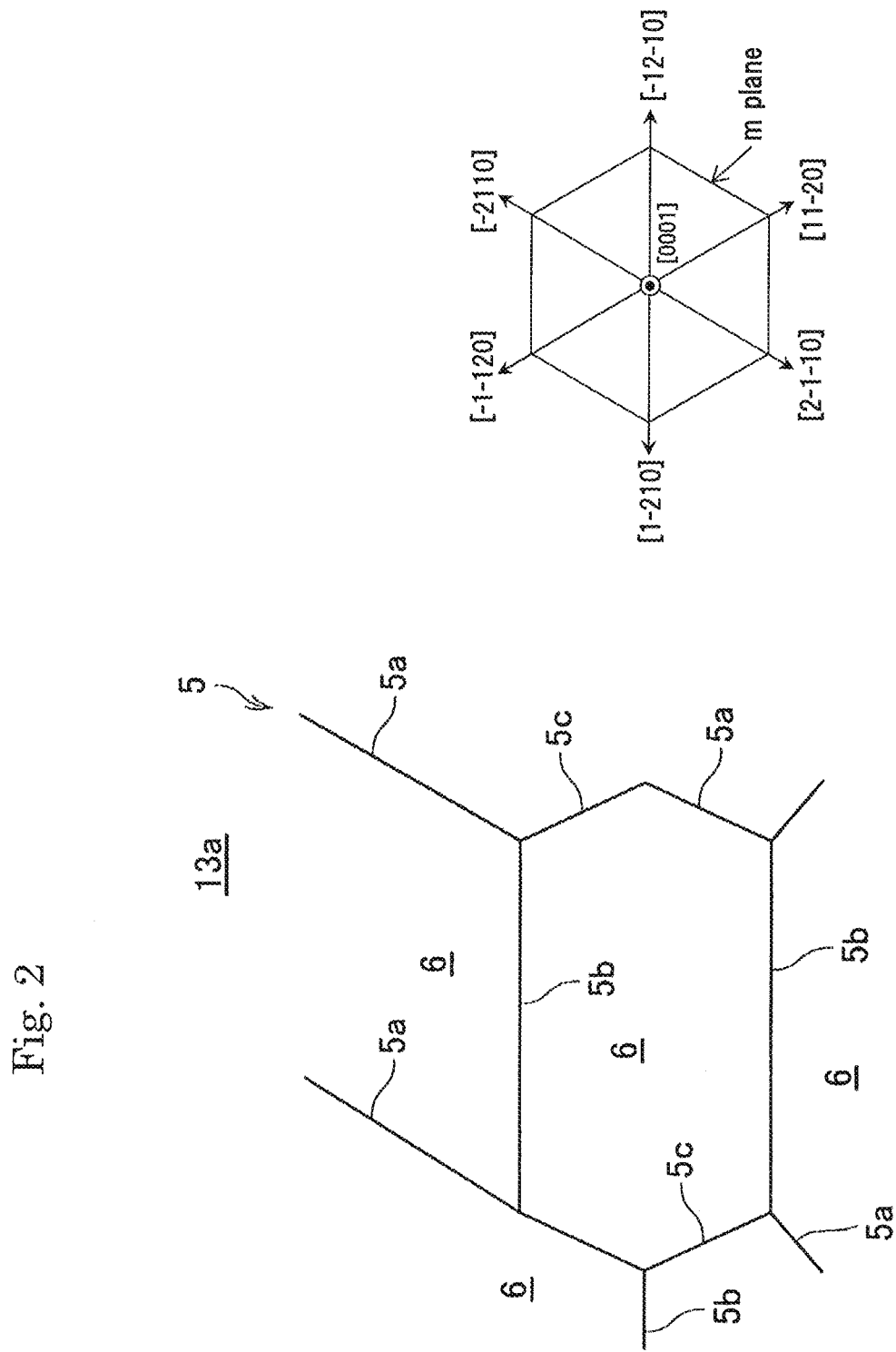
FIG. 2 is a diagram schematically illustrating a cathode luminescence image of an upper surface of the layer of the crystal of the group 13 nitride.

Here, in the case that the upper surface 13a of the layer 13 of the crystal of the group 13 nitride is observed by cathode luminescence (CL), as schematically shown in FIG. 2, the upper surface 13a includes the linear high-luminance light-emitting part 5 and the low-luminance light-emitting region 6 adjacent to the high-luminance light-emitting part 5.

Here, the observation by CL is performed as follows.

A scanning type electron microscope (SEM) with a CL detector is used for the CL observation. For example, in the case when a scanning type electron microscope ("S-3400N" supplied by HITACHI Hi Technologies Co. Ltd.) equipped with Mini CL system produced by Gatan is used, it is preferred to insert the CL detector between a sample and an object lens under the measurement conditions of an acceleration voltage of 10 kV, probe current "90", at a working distance (W. D.) of 22.5 mm and a magnitude of 50 folds.

Further, the high-luminance light-emitting part and low-luminance light-emitting region are distinguished based on the observation by the cathode luminescence as follows.

As to brightness of an image observed by CL under the conditions of an acceleration voltage of 10 kV, probe current "90", a working distance (W. D.) of 22.5 mm and a magnitude of 50 folds, an image processing software (for example, "WinRoof Ver 6.1.3" supplied by Mitani corporation) is used to prepare a histogram of gray scale of 256 grades whose vertical axis shows a degree and horizontal axis shows brightness (GRAY). As shown in FIG. 10, two peaks are confirmed in the histogram. The brightness at which the degree exhibits its minimum value between the two peaks is defined as a boundary, and the higher side is defined as the high-luminance light emitting part and the lower side is defined as the low-luminance light-emitting region.

Further, on the upper surface of the layer of the crystal of the group 13 nitride, the linear high-luminance light emitting part and low-luminance light-emitting region are adjacent to each other. The adjacent low-luminance light-emitting regions are distinguished by the linear high-luminance light-emitting part between them. Here, the linearity of the high-luminance light-emitting part means that the high-luminance light-emitting part is elongated lengthwise between the adjacent low-luminance light-emitting regions to provide a boundary line.

Here, the line of the high-luminance light emitting part may be a straight line, curved line or a combination of a straight line and curved line. The curved line includes various shapes such as circle, ellipse, parabola and hyperbola. Further, the high-luminance light emitting parts extending in different directions may be continuous with each other, and an end of the high-luminance light-emitting part may be discontinued.

On the upper surface of the layer of the crystal of the group 13 nitride, the low-luminance light-emitting region may be the exposed surface of the crystal of the group 13 nitride grown thereunder and extended two-dimensionally and in a planar shape. On the other hand, the high-luminance light-emitting part may be a linear shape and extended one-dimensionally to provide the boundary line dividing the adjacent low-luminance light-emitting regions. For example it is considered that dopant components, minute components and the like are discharged from the crystal of the group 13 nitride grown from the bottom and concentrated between the nitride crystals adjacent with each other during the growth, thereby generating a linear and strong light-emitting part between the adjacent low-luminance light-emitting regions on the upper surface.

Figure 3:
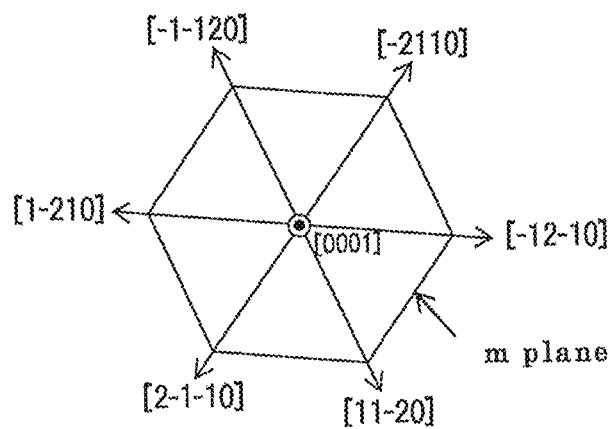
FIG. 3 is a photograph showing a cathode luminescence image of an upper surface of the layer of the crystal of the group 13 nitride.
Figure 3:
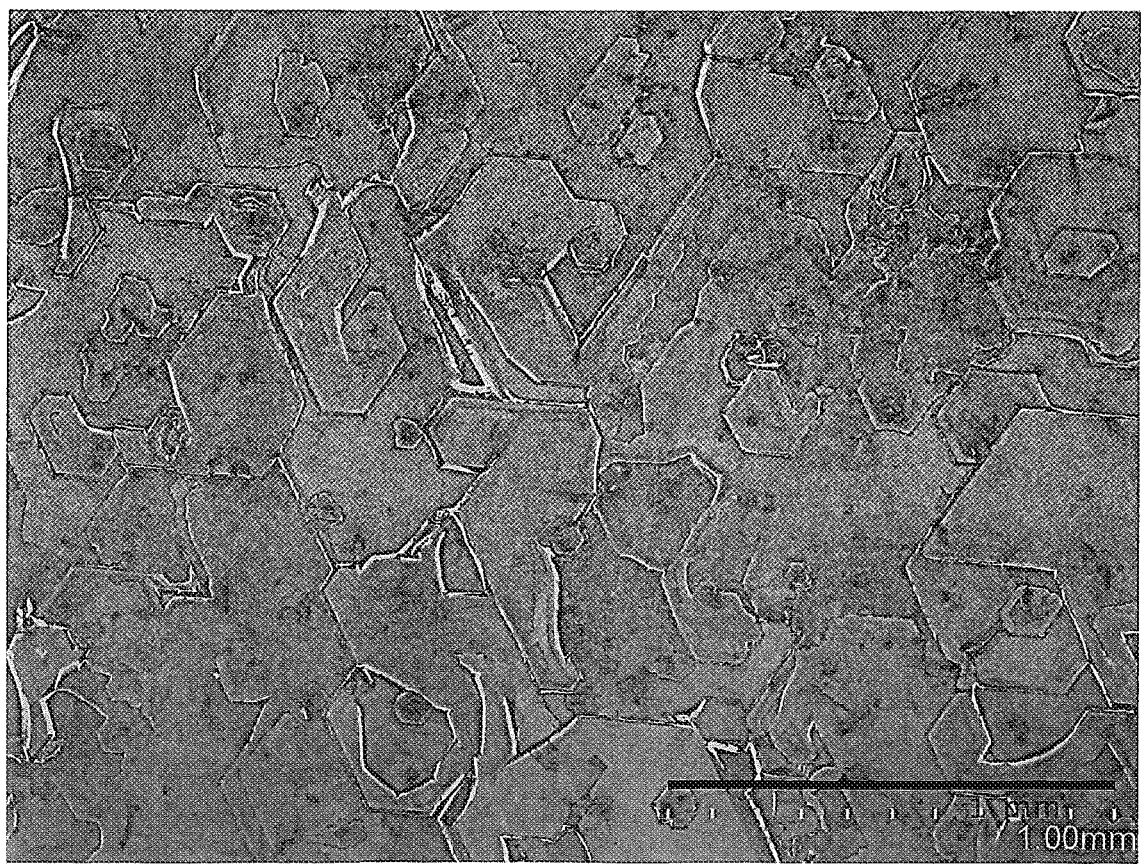
Figure 4:
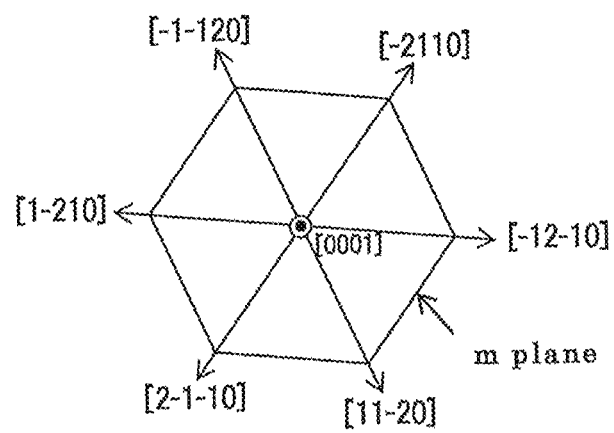
FIG. 4 is a photograph showing an enlarged view of FIG. 3.
Figure 4:
Figure 5:
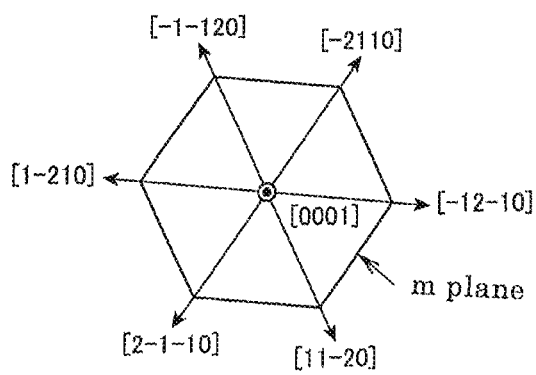
FIG. 5 is a diagram corresponding with the cathode luminescence image of FIG. 4.
Figure 5:
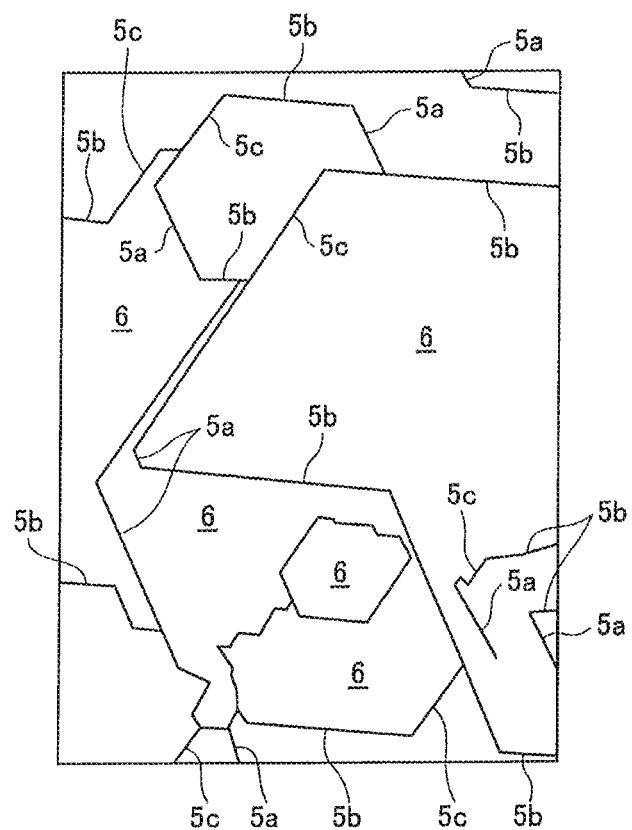

For example, FIG. 3 shows a photograph taken by CL observation of the upper surface of the layer of the crystal of the group 13 nitride obtained in the inventive example. FIG. 4 is an enlarged view of FIG. 3, and FIG. 5 schematically shows a diagram corresponding to FIG. 4. It is shown that the low-luminance light-emitting region is extended two-dimensionally, and the high-luminance light-emitting part is linear-shaped and elongated one-dimensionally as the boundary line dividing the adjacent low-luminance light-emitting regions.

As such, the shape of the low-luminance light-emitting region is not particularly limited, and normally elongated planarly and two-dimensionally. On the other hand, it is necessary that the line of the high-luminance light-emitting part is of an elongate shape. The width of the high-luminance light-emitting part may preferably be 100 μm or smaller, more preferably 20 μm or smaller and particularly preferably 5 μm or smaller. Further, the width of the high-luminance light-emitting part is normally 0.01 μm or larger.

Further, the ratio (length/width) of the length and width of the high-luminance light-emitting part is preferably 1 or more and more preferably 10 or more.

Further, on the upper surface, the ratio of the area of the high-luminance light-emitting parts with respect to the area of the low-luminance light-emitting regions (area of high-luminance light-emitting parts/area of low-luminance light-emitting regions) is preferably 0.001 or more and more preferably 0.01 or more.

Further, on the upper surface, the ratio of the area of the high-luminance light-emitting parts with respect to the area of the low-luminance light-emitting regions (area of high-luminance light-emitting parts/area of low-luminance light-emitting regions) is preferably 0.3 or less and more preferably 0.1 or less.

According to a preferred embodiment, the high-luminance light-emitting part includes a portion extending along the m-plane of the nitride of the crystal of the group 13 element. For example, according to the examples shown in FIGS. 2 and 5, the high-luminance light-emitting part 5 is elongated in an elongate shape and includes portions 5a, 5b and 5c elongating along the m-plane. The directions along the m-plane of the hexagonal crystal of the nitride of the group 13 element are, specifically, [−2110], [−12-10], [11-20], [2-1-10], [1-210] or [−1-120] direction. The high-luminance light-emitting part 5 includes a part of a side of a substantially hexagonal shape reflecting the hexagonal crystal. Further, the linear high-luminance light-emitting part is elongated along the m-plane, meaning that the lengthwise direction of the high-luminance light-emitting part is elongated in the direction of each of [−2110], [−12-10], [11-20], [2-1-10], [1-210] and [−1-120]. Specifically, the lengthwise direction of the linear high-luminance light-emitting part may be inclined preferably by ±1° and more preferably by ±0.3° with respect to the m-plane.

According to a preferred embodiment, on the upper surface, the linear high-luminance light-emitting part is elongated approximately along the m-plane of the crystal of the nitride of the group 13 element. This means that a main portion of the high-luminance light-emitting part is elongated along the m-plane and preferably the continuous phase of the high-luminance light-emitting part is elongated approximately along the m-plane. In this case, the portion extending in the direction along the m-plane preferably occupies 60 percent or more, more preferably 80 percent or more and may occupy substantially the whole of the whole length of the high-luminance light-emitting part.

Further, according to the present invention, the content of oxygen atoms is $1\times10^{18}$ atom/cm$^3$ or less, the contents of silicon atoms, manganese atoms, carbon atoms, magnesium atoms and calcium atoms are $1\times10^{17}$ atom/cm$^3$ or less, respectively, the content of chromium atoms is $1\times10^{16}$ atom/cm$^3$ or less and the content of chlorine atoms is $1\times10^{15}$ atom/cm$^3$ or less. By suppressing the contents of these atoms to the minute amounts described above, the high-luminance light-emitting part extending along the m-plane tends to generate uniformly over the whole surface, so that it is possible to further suppress the deviation of a property of the functional layer formed thereon.

The content of oxygen atoms is preferably $1\times10^{17}$ atom/cm$^3$ or less, and more preferably $1\times10^{16}$ atom/cm$^3$ or less. The contents of silicon atoms, manganese atoms and carbon atoms is preferably $1\times10^{16}$ atom/cm$^3$ or less and more preferably $1\times10^{15}$ atom/cm$^3$ or less. The contents of magnesium atoms and calcium atoms is preferably $2\times10^{16}$ atom/cm$^3$ or less and more preferably $1\times10^{1}$ atom/cm$^3$ or less. The content of chromium atoms is preferably $2\times10^{15}$ atom/cm$^3$ or less and more preferably $1\times10^{15}$ atom/cm$^3$ or less. The content of chlorine atoms is preferably $2\times10^{14}$ atom/cm$^3$ or less and more preferably $1\times10^{14}$ atom/cm$^3$ or less.

Further, it is generally difficult to reduce the content of oxygen atoms, silicon atoms, manganese atoms, carbon atoms, magnesium atoms, calcium atoms, chromium atoms and chlorine atoms in the layer of the crystal of the group 13 nitride to $1\times10^{12}$ atom/cm$^3$ or less, and the contents are preferably $1\times10^{12}$ atom/cm$^3$ or more from a practical viewpoint.

The measurement of the content of each atom contained in the layer of the crystal of the group 13 nitride is performed by SIMS (secondary ion mass analysis method).

According to a preferred embodiment, on the upper surface of the layer of the crystal of the group 13 nitride, the high-luminance light-emitting part constitute a continuous phase and the low-luminance light-emitting region constitutes a discontinuous phase divided by the high-luminance light-emitting part. For example, as shown in the schematic views of FIGS. 2 and 5, the linear high-luminance light-emitting part 5 forms the continuous phase and the low-luminance light-emitting regions form the continuous phases divided by the high-luminance light-emitting part.

Here, although the continuous phase means that the high-luminance light-emitting part 5 is continuous on the upper surface, it does not necessarily mean that all the high-luminance light emitting parts 5 are completely continuous, and it is permitted that a small part of the high-luminance light-emitting part 5 is separated from the other high-luminance light-emitting part 5 as far as it does not affect the whole pattern.

Further, the dispersed phase means that the low-luminance light-emitting regions 6 are approximately divided by the high-luminance light-emitting part 5 into many regions which are not continuous. Further, in the case that the low-luminance light-emitting regions 6 are divided by the high-luminance light-emitting part 5 on the upper surface, it is permitted that the low-luminance light-emitting regions 6 are continuous inside of the layer of the crystal of the group 13 nitride.

According to a preferred embodiment, the half value width of the reflection at (0002) plane of an X-ray rocking curve on the upper surface of the crystal layer of the group 13 nitride is 3000 seconds or less and 20 seconds or more. This indicates that the surface tilt angle is low and the crystal orientations are highly oriented, as a whole, as a single crystal, on the upper surface. As the microstructure has the cathode luminescence distribution as described above and the crystal orientations at the surface are highly orientated as a whole as such, it is possible to reduce the distribution of property on the upper surface of the layer of the crystal of the group 13 nitride, to obtain uniform properties of various kinds of functional devices provided thereon and to improve the yield of the functional devices.

The half value width of the reflection at (0002) plane of an X-ray rocking curve on the upper surface of the crystal layer of the group 13 nitride is preferably 1000 seconds or less and 20 seconds or more, and more preferably 500 seconds or less and 20 seconds or more. It is actually difficult to make the half value width of the reflection at (0002) plane of an X-ray rocking curve on the upper surface of the crystal layer of the group 13 nitride lower than 20 seconds.

Further, the reflection at (0002) plane of the rocking curve is measured as follows. An XRD system (for example, D8-DISCOVER supplied by Bruker-AXS) is used to perform the measurement under conditions of a tube voltage of 40 kV, a tube current of 40 mA, a collimator size of 0.1 mm, an anti-scattering slit of 3 mm, a range of ω=angle of peak position of ±0.3°, an ω step width of 0.003° and a counting time of 1 second. According to the measurement, it is preferred to use a Ge (022) non-symmetrical monochromator to convert a CuKα ray to parallel and a monochrome ray (half value width of 28 seconds) and to perform the measurement after standing the axis at a tilt angle CHI of about 0°. Then, the half value width of reflection at (0002) plane of an X-ray rocking curve can be calculated by using an XRD analysis software (supplied by Bruker-AXS, LEPTOS4.03) and performing a peak search. It is preferred to apply peak search condition of Noise filter "10", Threshold "0.30" and Points "10".

Figure 6:
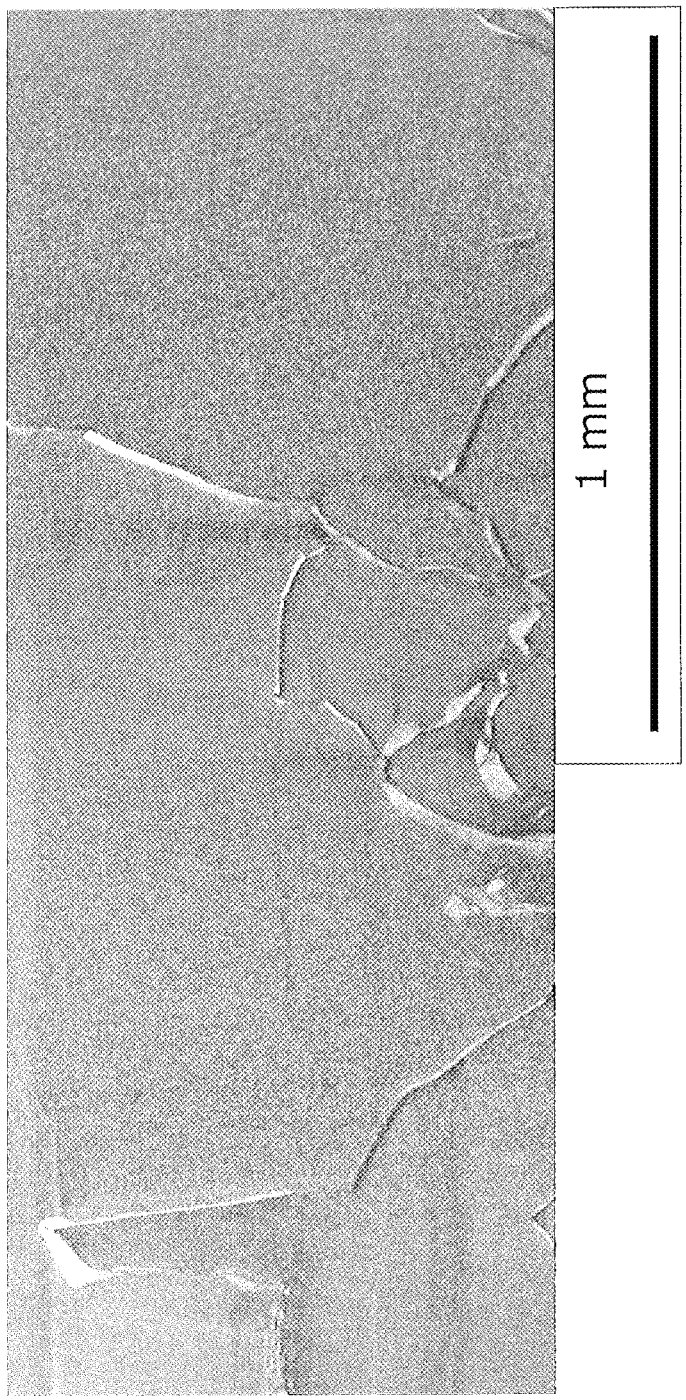
FIG. 6 is a photograph showing a cathode luminescence image of a cross section of the layer of the crystal of the group 13 nitride.

When a cross section substantially perpendicular to the upper surface of the crystal layer of the group 13 nitride is observed by CL, as shown in FIG. 6, linear high-luminance light-emitting parts emitting white light may be observed. Here, as shown in FIG. 6, it is shown that the low-luminance light-emitting region is extended planarly and two-dimensionally and that the high-luminance light-emitting part is elongated linearly to form a kind of a boundary line dividing the adjacent low-luminance light-emitting regions. The method of observing such a high-luminance light-emitting part and a low-luminance light emitting region is the same as the method of observing a high-luminance light-emitting part and a low-luminance light emitting region on the upper surface.

The shape of the low-luminance light emitting region on the cross section of the layer of the crystal of the group 13 nitride is not particularly limited, and is normally elongated planarly and two-dimensionally. On the other hand, it is necessary that the line formed by the high-luminance light-emitting part is of an elongate shape. The width of the high-luminance light-emitting part is preferably 100 μm or smaller and more preferably 20 μm or smaller. Further, the width of the high-luminance light-emitting part is normally 0.01 μm or larger.

Further, the ratio of the length and width (length/width) of the light-emitting part at the cross section of the crystal layer of the group 13 nitride is preferably 1 or larger and more preferably 10 or larger.

According to a preferred embodiment, on the cross section substantially perpendicular to the upper surface of the layer of the crystal of the group 13 nitride, the linear high-luminance light-emitting part forms a continuous phase, and the low-luminance light-emitting region forms a discontinuous phase divided by the high-luminance light-emitting part. For example, according to a photograph taken by CL of FIG. 6, the linear high-luminance light-emitting part forms the continuous phase, and the low-luminance light-emitting region forms the discontinuous phase divided by the high-luminance light-emitting part.

Here, a continuous phase means that the high-luminance light-emitting part is continuous in the cross section and does not necessarily mean that all of the high-luminance light-emitting parts are completely continuous. It is thus approved that a small portion of the high-luminance light-emitting parts is separated from the other high-luminance light emitting parts as far as it does not affect the whole pattern.

Further, a discontinuous phase means that the low-luminance light-emitting regions are approximately divided by the high-luminance light emitting part into many regions which are not continuous.

According to a preferred embodiment, voids are not observed in the cross section substantially perpendicular to the upper surface of the layer of the crystal of the group 13 nitride. That is, as shown in the SEM photograph of FIG. 7 in the same visual field as the photograph of FIG. 6, voids (spaces) and crystal phases other than the crystal of the group 13 nitride are not observed. Here, the presence of voids is observed as follows.

The voids are observable by observing the cross section substantially perpendicular to the upper surface of the layer of the crystal of the group 13 nitride by a scanning type electron microscope (SEM), and the void is defined as a space whose maximum width is 1 μm to 500 μm. A scanning type electron microscope ("S-3400N" supplied by HITACHI Hi Technologies Co. Ltd.) is used for the SEM observation, for example. It is preferred to apply the measurement conditions of an acceleration voltage of 15 kV, a probe current "60", a working distance (W. D.) of 6.5 mm and a magnitude of 100 folds.

Further, when a cross section substantially perpendicular to the upper surface of the layer of the crystal of the group 13 nitride is observed by the scanning type electron microscope (under the measurement conditions as described above), clear grain boundaries accompanied with structural macro defects such as voids are not observed. For such a microstructure, it is thought that the increase of resistance or deviation of a property due to the clear grain boundaries can be suppressed when a functional device such as a light-emitting device is produced on the layer of the crystal of the group 13 nitride.

Further, according to a preferred embodiment, the dislocation density on the upper surface of the layer of the crystal of the group 13 nitride is $1 \times 10^2/cm^2$ or more and $1 \times 10^6/cm^2$ or less. It is particularly preferred to make the dislocation density $1 \times 10^6/cm^2$ or less, from the standpoint of improving the properties of the functional device. The dislocation density is more preferably $1 \times 10^4/cm^2$ or less. The dislocation density is to be measured as follows.

A scanning type electron microscope (SEM) with a CL detector maybe used for the measurement of the dislocation density. For example, when a scanning type electron microscope ("S-3400N" supplied by HITACHI Hi Technologies Co. Ltd.) equipped with Mini CL system produced by Gatan is used for the CL observation, the dislocated positions are observed as dark spots without emitting light. The density of the dark spots is measured to calculate the dislocation density. It is measured under the measurement conditions of an acceleration voltage of 10 kV, a probe current "90", a working distance (W. D.) of 22.5 mm and a magnitude of 1200 folds, while the CL detector is inserted between a sample and an object lens.

Further, according to a preferred embodiment, the half value widths of the reflection at the (0002) plane and of the reflection at the (1000) plane of the X-ray rocking curve on the upper surface of the crystal layer of the group 13 nitride are 3000 seconds or less and 20 seconds or higher and 10000 seconds or less and 20 seconds or higher, respectively. This means that both the surface tilt angle and surface twist angle on the upper surface are low, and that the crystal orientations are highly orientated as a whole as a single crystal. As the microstructure has the crystal orientations at the surface highly orientated as a whole, it is possible to reduce the distribution of properties on the upper surface of the layer of the crystal of the group 13 nitride, to obtain uniform properties of various functional devices provided thereon and to improve the yield of the functional devices.

Further, according to a preferred embodiment, the half value width of the reflection at (1000) plane of the X-ray rocking curve on the upper surface of the crystal layer of the group 13 nitride is 10000 seconds or less and 20 seconds or higher. This indicates that the surface twist angle is very low on the upper surface and that the crystal orientations are highly orientated as a whole as a single crystal. As the microstructure has the cathode luminescence distribution as described above and the crystal orientations on the surface are highly orientated as a whole, it is possible to reduce the distribution of properties at the upper surface of the crystal layer of the group 13 nitride, to obtain uniform properties of various functional devices provided thereon and to improve the yield of the functional devices.

The half value width of the reflection at (1000) plane of the X-ray rocking curve on the upper surface of the crystal layer of the group 13 nitride is preferably 5000 seconds or less, more preferably 1000 seconds or less and more preferably 20 seconds or higher. Further, it is difficult to make the half value width to a value lower than 20 seconds.

Further, the reflection at (1000) plane of the rocking curve is measured as follows. An XRD system (for example, D8-DISCOVER supplied by Bruker-AXS) is used to perform the measurement under conditions of a tube voltage of 40 kV, a tube current of 40 mA, no collimator, an anti-scattering slit of 3 mm, a range of $\omega$=angle of peak position of ±0.3°, an $\omega$ step width of 0.003° and a counting time of 4 seconds. It is preferred to use a Ge (022) non-symmetrical reflection monochromator to convert a CuK$\alpha$ ray to parallel and a monochrome ray (half value width of 28 seconds) and to perform the measurement after standing the axis at a tilt angle CHI of about 88°. Then, the half value width of reflection at (1000) plane of the X-ray rocking curve can be calculated by using an XRD analysis software (supplied by Bruker-AXS, LEPTOS4.03) and performing peak search. It is preferred to apply peak search conditions of Noise filter "10", Threshold "0.30" and Points "10".

(Preferred Example of Production)

A preferred embodiment of production of the crystal layer of the group 13 nitride is as follows.

The crystal layer of the group 13 nitride can be produced by forming a seed crystal layer on an underlying substrate and by forming the crystal layer of the nitride of the group 13 element.

For example, as exemplified in FIG. 1, the underlying substrate is formed by forming an alumina layer 2 on a single crystal substrate 1. The material of the single crystal substrate 1 includes sapphire, AlN template, GaN template, free-standing GaN substrate, SiC single crystal, MgO single crystal, spinel ($MgAl_2O_4$), $LiAlO_2$, $LiGaO_2$, and a perovskite composite oxide such as $LaAlO_3$, $LaGaO_3$ or $NdGaO_3$ and SCAM ($ScAlMgO_4$). Further, a cubic perovskite composite oxide represented by the composition formula $[A_{1-y}(Sr_{1-x}Ba_x)_y] [(Al_{1-z}Ga_z)_{1-u}D_u] O_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) may be used.

The method of forming the alumina layer 2 includes known methods such as sputtering, MBE (molecular beam epitaxy), vapor deposition, mist CVD method, sol-gel method, aerosol deposition (AD) method, and the method of producing an alumina sheet by tape casting or the like and adhering the alumina sheet onto the single crystal substrate. Sputtering is particularly preferred. Optionally, the alumina layer may be subjected to heat treatment, plasma treatment or ion beam irradiation after the formation. The method of heat treatment is not particularly limited, and the heat treatment may be performed under air atmosphere, vacuum, reduced atmosphere such as hydrogen or the like or inert atmosphere such as nitrogen, argon or the like. The heat treatment may be further performed under a pressure using a hot press (HP) furnace, a hot isostatic press (HIP) furnace or the like.

As the underlying substrate, a sapphire substrate subjected to the heat treatment, plasma treatment or ion beam irradiation as described above may be used.

Figure 1A:
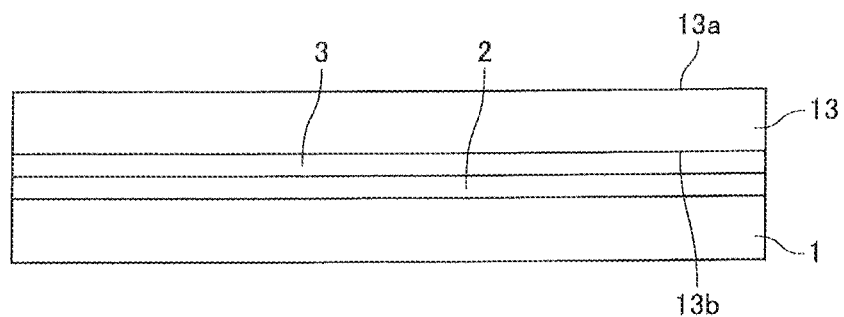
FIG. 1(a) shows the state that an alumina layer, a seed crystal layer and a layer of a crystal of a group 13 nitride are provided on a supporting body.
Figure 1B:
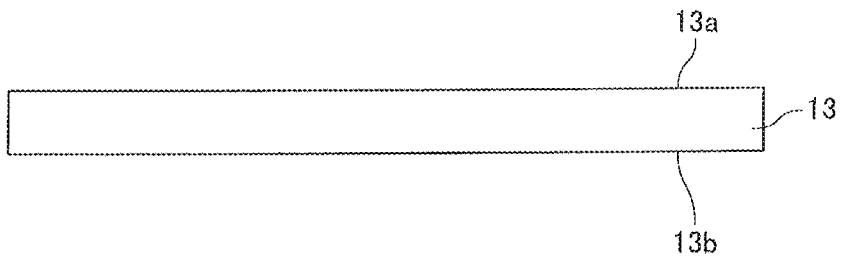
FIG. 1(b) shows the layer of the crystal of the group 13 nitride separated from the supporting body.

Then, as shown in FIG. 1(a), a seed crystal layer 3 is provided on the alumina layer 2 produced as described above or on the single crystal substrate subjected to the heat treatment, plasma treatment or ion beam irradiation as described above. The material forming the seed crystal layer 3 is composed of one or two or more kinds of nitride of a group 13 element defined by IUPAC. The group 13 element is preferably gallium, aluminum, or indium. Specifically, the crystal of the nitride of the group 13 element is preferably GaN, AlN, InN, $Ga_xAl_{1-x}N$ (1>x>0), $Ga_xIn_{1-x}N$ (1>x>0) or $Ga_xAl_yInN$ (1>x>0, 1>y>0).

Although the method of forming the seed crystal layer 3 is not particularly limited, it may be a vapor phase process such as MOCVD (metal organic chemical vapor deposition), MBE (molecular beam epitaxy), HVPE (hydride vapor epitaxy), sputtering and the like, a liquid phase process such as Na flux method, ammonothermal method, hydrothermal method and sol-gel method, a powder method utilizing solid phase growth of powder, and combinations thereof.

For example, in the case that the seed crystal layer is formed by MOCVD method, preferably, a low-temperature GaN buffer layer is deposited at 20 to 50 nm at 450 to 550° C. and a GaN film is then deposited in a thickness of 2 to 4 µm at 1000 to 1200° C.

The crystal layer 13 of the group 13 nitride is formed so that the crystal orientations approximately conform to the crystal orientations of the seed crystal layer 3. The method of forming the crystal layer 13 of the group 13 nitride is not particularly limited as long as its crystalline orientation is substantially aligned with the crystal orientation of the seed crystal film and/or seed crystal layer. Vapor phase methods such as MOCVD, HVPE and the like, liquid phase methods such as Na flux method, ammonothermal method, hydrothermal method and sol-gel method, a powder method utilizing solid phase growth of powder, and combinations thereof are preferable. It is particularly preferred to be performed by Na flux method.

In the case that the crystal layer of the group 13 nitride is formed by Na flux method, it is preferred to strongly agitate the melt and to mix the melt uniformly and sufficiently. Although such an agitation method includes swinging, rotation and vibration, the method is not limited.

The formation of the crystal layer of the group 13 nitride by Na flux method is preferably performed by filling, in a crucible with the seed crystal substrate provided therein, a melt composition containing a group 13 metal, Na metal and optionally a dopant (for example, an n-type dopant such as germanium (Ge), silicon (Si), oxygen (O) or the like or a p-type dopant such as beryllium (Be), magnesium (Mg), calcium (Ca), strontium (Sr), zinc (Zn), cadmium (Cd) or the like), by elevating the temperature and pressure to 830 to 910° C. and 3.5 to 4.5 MPa under nitrogen atmosphere, and then by rotating the crucible while the temperature and pressure are held. The holding time may be 10 to 100 hours, although it varies depending on the target film thickness.

Further, the thus obtained gallium nitride crystal produced by the Na flux method is preferably subjected to grinding by a grinder to make the surface flat, and the surface is preferably flattened by lapping using diamond grinding stones.

(Method of Separating Layer of Crystal of Group 13 Nitride)

Then, the layer of the crystal of the group 13 nitride may be separated from the single crystal substrate to obtain a free-standing substrate including the crystal layer of the group 13 nitride.

The method of separating the crystal layer of the group 13 nitride from the single crystal substrate is not limited. According to a preferred embodiment, the crystal layer of the group 13 nitride is naturally separated from the single crystal substrate, during a cooling step after growing the crystal layer of the group 13 nitride.

Alternatively, the crystal layer of the group 13 nitride may be separated from the single crystal substrate by chemical etching.

Etchants for performing the chemical etching are preferably a strong acid such as sulfuric acid, chloric acid or the like, a mixed solution of sulfuric acid and phosphoric acid, or a strong alkali such as a sodium hydroxide aqueous solution, potassium hydroxide aqueous solution or the like.

Further, the chemical etching is preferably performed at a temperature of 70° C. or higher.

Alternatively, the crystal layer of the group 13 nitride may be peeled off from the single crystal substrate by a laser lift-off method.

Alternatively, the crystal layer of the group 13 nitride may be peeled off from the single crystal substrate by grinding.

Alternatively, the crystal layer of the group 13 nitride may be peeled off from the single crystal substrate with a wire saw.

(Free-Standing Substrate)

The crystal layer of the group 13 nitride may be separated from the single crystal substrate to obtain a free-standing substrate.

The term "free-standing substrate" as used herein means a substrate that cannot be deformed or broken under its own weight during handling and can be handled as a solid. The free-standing substrate of the present invention can be used not only as a substrate for various types of semiconductor devices such as light emitting devices, but also as a member or a layer other than the base material, such as an electrode (which may be a p-type electrode or an n-type electrode), a p-type layer, or an n-type layer. The free-standing substrate may include one or more of the other layers.

In the case that the crystal layer of the group 13 nitride forms the free-standing substrate, the free-standing substrate should have a thickness that allows for free-standing and preferably has a thickness of 20 µm or more, more preferably 100 µm or more, and further preferably 300 µm or more. No upper limit should be set on the thickness of the free-standing substrate, but it is realistic to have a thickness of 3000 µm or less in terms of manufacturing cost.

(Composite Substrate)

The single crystal substrate with the crystal layer of the group 13 nitride provided thereon can be used as a template substrate for forming another functional layer thereon without separating the crystal layer of the group 13 nitride.

(Functional Device)

The functional device structure provided on the crystal layer of the group 13 nitride is not particularly limited, but it may have the function of light-emitting, rectifying electric power-controlling.

The structure or production method of a light-emitting device using the crystal layer of the group 13 nitride of the present invention is not limited. Typically, the light-emitting device is produced by providing a light-emitting functional layer on the crystal layer of the group 13 nitride. Further, the crystal layer of the group 13 nitride maybe used as an electrode (possible p-type electrode or n-type electrode), or a member or layer other than p-type layer or n-type layer or the like to produce the light-emitting device.

Figure 8:
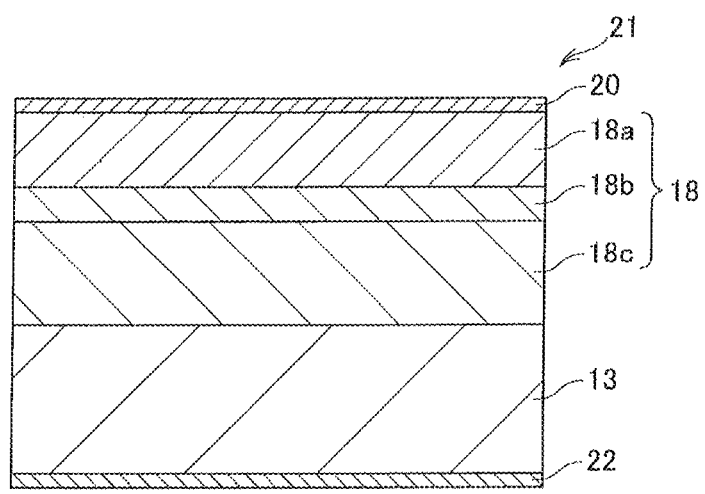
FIG. 8 is a diagram schematically showing a functional device of the present invention.

FIG. 8 schematically shows the construction of layers according to an embodiment of the present invention. The light-emitting device 21 shown in FIG. 8 includes a free-standing substrate 13 and a light emitting function layer 18 formed on the substrate. The light-emitting function layer 18 provides light-emission based on the principle of a light-emitting device such as LED or the like by appropriately providing an electrode or the like and applying a voltage.

The light emitting functional layer 18 is formed on the substrate 13. The light emitting functional layer 18 may be provided entirely or partially on the surface of the substrate 13 or may be provided entirely or partially on a buffer layer, to be described hereinafter, if the buffer layer is formed on the substrate 13. The light emitting functional layer 18 may take one of various known layer configurations that provide light emission based on the principle of light emitting devices as represented by LED's by appropriately providing electrodes and/or phosphors thereon and applying a voltage therebetween. Accordingly, the light emitting functional layer 18 may emit visible light of, for example, blue and red or may emit ultraviolet light without or with visible light. The light emitting functional layer 18 preferably forms at least a part of a light emitting device that exploits a p-n junction and the p-n junction may include an active layer 18b between a p-type layer 18a and an n-type layer 18c, as shown in FIG. 8. In this case, a double heterojunction or a single heterojunction (hereinafter referred to collectively as heterojunction) may be employed in which the active layer has a bandgap smaller than that of the p-type layer and/or the n-type layer. A quantum well structure in which the active layer is thinned may also be taken as one form of p-type layer/active layer/n-type layer. A double heterojunction in which the active layer has a bandgap smaller than that of the p-type layer and the n-type layer should obviously be employed to obtain a quantum well. Many quantum well structures may also be stacked to provide a multiple quantum well (MQW) structure. These structures allow a higher luminous efficiency compared to a p-n junction. The light emitting functional layer 18 thus preferably includes a p-n junction, a heterojunction, and/or a quantum well junction having a light emitting feature. Further, 20 and 22 represent examples of electrodes.

Accordingly, one or more layers forming the light emitting functional layer 18 can include at least one or more selected from the group consisting of the n-type layer with n-type dopants doped therein, the p-type layer with p-type dopants doped therein, and the active layer. In the n-type layer, the p-type layer, and the active layer (if one exists), the main components maybe of the same material or may be of respectively different materials.

The material of each layer forming the light emitting functional layer 18 is not particularly limited as long as it is grown in a manner generally following the crystal orientation of the crystal layer of the group 13 nitride and having a light emitting function, but preferably includes one or more selected from a gallium nitride (GaN)-based material, a zinc oxide (ZnO)-based material, and an aluminum nitride (AlN)-based material as the main component and may appropriately contain dopants for controlling of p-type or n-type. A gallium nitride (GaN)-based material is particularly preferable. The material of the light emitting functional layer 18 may be a mixed crystal with, for example, AlN, InN, etc. solid-solved in GaN to control the bandgap. As mentioned in the last paragraph, the light emitting functional layer 18 may employ the heterojunction composed of multiple types of material systems. For example, the p-type layer may employ a gallium nitride (GaN)-based material, while the n-type layer may employ a zinc oxide (ZnO)-based material. Alternatively, the p-type layer may employ a zinc oxide (ZnO)-based material, while the active layer and the n-type layer may employ a gallium nitride (GaN)-based material, the combination of materials being not particularly limited.

The film formation method for the light emitting functional layer 18 and the buffer layer is preferably exemplified by a gas phase method such as MOCVD, MBE, HVPE, or sputtering, a liquid phase method such as Na flux method, ammonothermal method, hydrothermal method, or sol-gel method, a powder method utilizing the solid phase growth of powder, or combinations thereof, though not particularly limited as long as being grown in a manner generally following the crystal orientation of the crystal layer of the group 13 nitride.

EXAMPLES

Inventive Example 1

(Production of Gallium Nitride Free-Standing Substrate)

An alumina film 2 with a thickness of 0.3 μm was film-formed by sputtering and a seed crystal film 3 composed of gallium nitride and with a thickness of 2 μm was film-formed by a MOCVD method on a sapphire substrate 1 with a diameter of 6 inches to provide a seed crystal substrate.

The seed crystal substrate was placed in an alumina crucible in a glove box filled with nitrogen atmosphere. Then, gallium metal and sodium metal were filled in the crucible so that Ga/Ga+Na (mol %) was 15 mol %, and the crucible was closed with an alumina plate. The crucible was disposed in an inner container of stainless steel, which was in an outer container of stainless steel capable of holding it, and the outer container was then closed with a container lid equipped with a pipe for introducing nitrogen. The outer container was positioned on a rotatable table provided in a heating part of a crystal production system which was subjected to baking under vacuum in advance, and a pressure-resistant container was sealed with a lid.

The inside space of the pressure-resistant container was then evacuated by a vacuum pump to a pressure or 0.1 Pa or less. While an upper heater, middle heater and lower heater were adjusted to heat the heated inside space to 870° C., nitrogen gas was introduced from a nitrogen gas canister to 4.0 MPa, and the outer container was rotated around a central axis at a rate of 20 rpm clockwise and anti-clockwise at a predetermined interval. The acceleration time was 12 seconds, holding time was 600 seconds, deceleration time was 12 seconds and stopping time was 0.5 seconds. Such state was maintained for 40 hours. Thereafter, the temperature and pressure were lowered to room temperature and atmospheric pressure through natural cooling, the lid of the pressure-resistant container was opened and the crucible was taken out from the inside. Solidified sodium metal in the crucible was removed to collect a gallium nitride free-standing substrate without cracks and separated from the seed crystal substrate.

(Evaluation)

Figure 9:
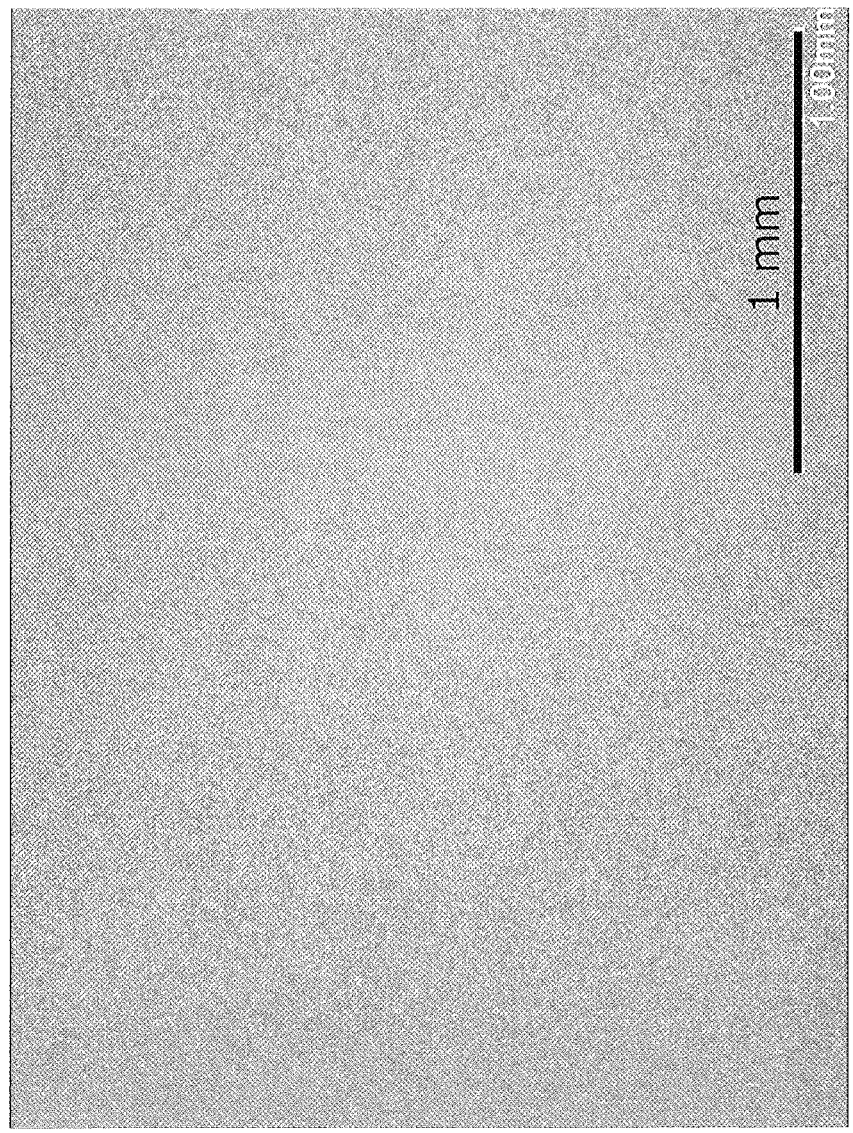
FIG. 9 is a photograph taken by a scanning type electron microscope of an upper surface of the layer of the crystal of the group 13 nitride.

The upper surface of the gallium nitride free-standing substrate was polished and observed by CL by means of a scanning type electron microscope (SEM) with a CL detector. As a result, as shown in FIG. 3, the high-luminance light-emitting parts emitting white light inside of the gallium nitride crystal was observed by the CL photograph. Further, at the same time, as shown in FIG. 9, the same visual field was observed by SEM, voids were not confirmed and uniform gallium nitride crystal was shown to be grown.

Figure 7:
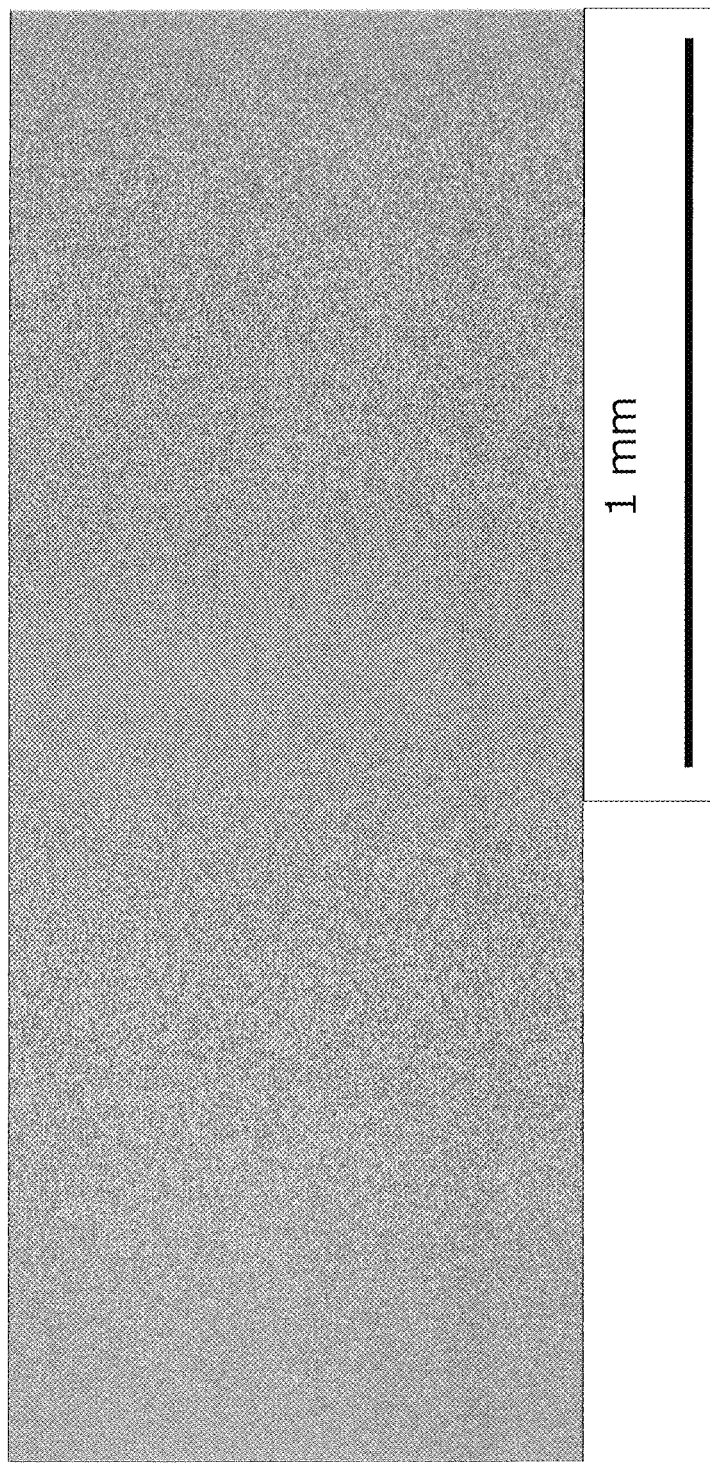
FIG. 7 is a photograph taken by a scanning type electron microscope showing a cross section of the layer of the crystal of the group 13 nitride.

Further, the gallium nitride free-standing substrate was cut along a cross section perpendicular to the upper surface, and the cut cross section was polished and observed by CL by means of the scanning type electron microscope (SEM) with the CL detector. As a result, as shown in FIG. 6, the high-luminance light-emitting parts emitting white light inside of the gallium nitride crystal was observed by the CL photograph. Further, at the same time, as shown in FIG. 7, the same visual field was observed by SEM, voids were not confirmed and uniform gallium nitride crystal was shown to be grown. That is, on the cross section of the crystal layer of the group 13 nitride, same as the upper surface, the high-luminance light-emitting parts were present according to the CL observation, a microstructure having the same or similar shape of the high-luminance light-emitting part shown in the CL photograph was not present, according to the SEM.

(Measurement of Dislocation Density)

The dislocation density of the upper surface of the crystal layer of the group 13 nitride was measured. The CL observation was performed to measure the density of dark spots at the dislocated positions so that the dislocation density was calculated. As a result of the observation of five visual fields, each having sizes of 80 μm×105 μm, it spanned a range of $1.2 \times 10^4/cm^2$ to $9.4 \times 10^4/cm^2$ with an average of $3.3 \times 10^4/cm^2$.

(Measurement of Surface Tilt Angle)

The half value width at (0002) plane of the X-ray rocking curve on the upper surface of the crystal layer of gallium nitride was measured, and was 73 seconds.

(Measurement of Surface Twist Angle)

The half value width at (1000) plane of the X-ray rocking curve on the upper surface of the crystal layer of gallium nitride was measured, and was 85 seconds.

(Contents of Respective Atoms)

The contents of the respective atoms were measured by SIMS. Specifically, an "IMS-7f" system supplied by CAMECA Corporation was used with $O_2^+$ or $Cs^+$ as primary ion specie, and a SIMS measurement was performed at an acceleration voltage of 5 kV to 15 kV, in a field of 20×20 μm or φ of 30 μm and in a depth of 3 μm from the surface. The results were as follows.

Oxygen atoms: $5 \times 10^{16}$ atom/$cm^3$
Silicon atoms: $3 \times 10^{15}$ atom/$cm^3$
Manganese atoms: $2 \times 10^{15}$ atom/$cm^3$
Carbon atoms: $6 \times 10^{15}$ atom/$cm^3$
Magnesium atoms: $3 \times 10^{15}$ atom/$cm^3$
Calcium atoms: $9 \times 10^{13}$ atom/$cm^3$
Chromium atoms: $8 \times 10^{14}$ atom/$cm^3$
Chlorine atoms: $2 \times 10^{14}$ atom/$cm^3$ (Film Formation of Light-Emitting Function Layer by MOCVD Method)

Using the MOCVD method, on the free-standing gallium nitride substrate, as a n-type layer, an n-GaN layer was deposited at lea m at 1050° C. and doped so that an atomic concentration of Si atoms became $5 \times 10^{18}/cm^3$. Then, as a light-emitting layer, multiple quantum well layers were deposited at 750° C. Specifically, five layers of well layers of 2.5 nm of InGaN and six layers of barrier layers of 10 nm of GaN were alternately deposited. Then, as a p-type layer, a p-type GaN was deposited at 200 nm at 950° C. and doped so that an atomic concentration of Mg atoms became $1 \times 10^{19}/cm^3$. Thereafter, it was taken out of the MOCVD apparatus and then subjected to heat treatment at 800° C. in nitrogen atmosphere for 10 minutes as an activating treatment of Mg ions in the p-type layer.

(Production of Light-Emitting Device)

Using a photolithography process and a vapor deposition method, on the opposite side of the n-GaN layer and p-GaN layer of the free-standing gallium nitride substrate, Ti film, Al film, Ni film and Au film were patterned in thicknesses of 15 nm, 70 nm, 12 nm and 60 nm, respectively, as a cathode electrode. Thereafter, for assuring ohm contact characteristics, heat treatment was performed at 700° C. for 30 seconds under nitrogen atmosphere. Further, using the photolithography process and the vapor deposition method, Ni film and Au film were patterned in thicknesses of 6 nm and 12 nm, respectively, as a transparent anode on the p-type layer. Thereafter, for assuring the ohmic contact characteristics, heat treatment was performed at 500° C. for 30 seconds under nitrogen atmosphere. Further, using the photolithography process and the vapor deposition method, on a partial region of a top surface of the Ni and Al films as the transparent anode, Ni film and Au film were patterned in thicknesses of 5 nm and 60 nm, respectively, as a pad for the anode. The thus obtained substrate was cut into chips, which were mounted on lead frames to obtain light-emitting devices of vertical type structure.

(Evaluation of Light-Emitting Device)

One hundred samples were arbitrarily selected from the produced devices, and electricity was directed between the cathode and anode to perform the I-V measurement. Rectification was confirmed in 90 of the samples. Further, current was directed in the forward direction to confirm the luminescence of light at a wavelength of 460 nm.

Further, uniform light emission over the whole surface of a light emitting surface of the light-emitting device was confirmed.

(Change of Atomic Ratio)

The ratio of each atom was adjusted as follows, by changing the condition of the melt.

Oxygen atom: $1 \times 10^{12}$ to $1 \times 10^{17}$ atom/$cm^3$
Silicon atom: $1 \times 10^{12}$ to $1 \times 10^{16}$ atom/$cm^3$
Manganese atom: $1 \times 10^{12}$ to $1 \times 10^{16}$ atom/$cm^3$
Carbon atom: $1 \times 10^{12}$ to $1 \times 10^{16}$ atom/$cm^3$
Magnesium atom: $1 \times 10^{12}$ to $2 \times 10^{16}$ atom/$cm^3$
Calcium atom: $1 \times 10^{12}$ to $2 \times 10^{16}$ atom/$cm^3$
Chromium atom: $1 \times 10^{12} \sim 2 \times 10^{15}$ atom/$cm^3$
Chlorine atom: $1 \times 10^{12}$ to $2 \times 10^{14}$ atom/$cm^3$.

Then, as the light-emitting devices were produced according to the same procedure as Example 1, uniform light-emission from the light-emitting surface was confirmed.

(Production of a Device Having Rectifying Function)

A functional device having rectifying function was produced.

Specifically, a shot key barrier diode structure was formed on the upper surface of the free-standing substrate obtained in the example, as follows, and electrodes were then formed thereon to obtain a diode, followed by confirmation of the characteristics.

(Film Formation of Rectifying Function Layer by MOCVD Method)

An n-GaN layer having a thickness of 5 μm, was formed on the free-standing substrate as an n-type layer using the MOCVD method (organic metal chemical vapor deposition) at 1050° C., so that it was doped with Si at an Si atom concentration of $1 \times 10^{16}/cm^3$.

Using the photolithography process and the vacuum deposition method, Ti/Al/Ni/Au films as an ohmic electrode were patterned on the surface on the side opposite to the n-GaN layer of the free-standing substrate in thicknesses of 15 nm, 70 nm, 12 nm, and 60 nm, respectively. Thereafter, to improve ohmic contact characteristics, heat treatment at 700° C. was performed in nitrogen atmosphere for 30 seconds. Furthermore, using the photolithography process and the vacuum deposition method, Ni/Au films were patterned as a shot key electrode on the n-GaN layer formed by the MOCVD method in thicknesses of 6 nm and 80 nm, respectively. The substrate obtained in this way was cut into chips, which were mounted on lead frames to obtain the rectifying devices.

(Evaluation of Rectifying Device)

As a result of the I-V measurement, a rectifying property was confirmed.

(Production of Electric Power-Controlling Device)

A functional device having the function of controlling electric power was produced.

A free-standing substrate was produced as the example. However, different from Example 1, in producing the gallium nitride crystal by an Na flux method, the doping of the impurity was not performed. On the surface of the free-standing substrate obtained in this way, an HEMT structure of $Al_{0.25}Ga_{0.75}N/GaN$ was produced by the MOCVD method as follows, an electrode was formed, and the transistor characteristics were confirmed.

Using the MOCVD method (organic metal chemical vapor deposition), an n-GaN layer was formed without the doping of the impurity in a thickness of 3 μm on the free-standing substrate as an i-type layer at 1050° C. The $Al_{0.25}Ga_{0.75}N$ layer was then produced as the functional layer at 25 nm at the same 1050° C. It was thus obtained the HEMT structure of $Al_{0.25}Ga_{0.75}N/GaN$.

Using the photolithography process and the vacuum deposition method, Ti/Al/Ni/Au films as source and drain electrodes were patterned in thicknesses of 15 nm, 70 nm, 12 nm, and 60 nm, respectively. Thereafter, to improve ohmic contact characteristics, 700° C. heat treatment was performed in nitrogen atmosphere for 30 seconds. Furthermore, using the photolithography process and the vacuum deposition method, Ni/Au films were patterned as a gate electrode by shot-key junction in thicknesses of 6 nm and 80 nm, respectively. The thus obtained substrate was cut into chips, which were mounted on lead frames to obtain the devices having the function of controlling electric power.

(Evaluation of Electric Power-Controlling Device)

When the I-V measurement was performed, good pinch-off characteristics were confirmed, in which the maximum drain current was 710 mA/mm and maximum transconductance was 210 mS/mm.

The invention claimed is:

1. A layer of a crystal of a nitride of a group 13 element, said crystal of said nitride being selected from gallium nitride, aluminum nitride, indium nitride and the mixed crystals thereof and comprising an upper surface and a bottom surface:
   wherein said upper surface consists essentially of a linear high-luminance light-emitting part and low-luminance light-emitting regions provided on both sides of said high-luminance light-emitting part,
   said linear high-luminance light-emitting part forms a continuous phase;
   said low-luminance light-emitting regions each forming a discontinuous phase divided by said linear high-luminance light-emitting part;
   said high-luminance light-emitting part comprises a portion extending along an m-plane of said crystal of said nitride of said group 13 element, said upper surface being observed by cathode luminescence; and
   wherein said crystal of said nitride of said group 13 element comprises oxygen atoms in a content of $1\times10^{18}$ atom/cm$^3$ or less, silicon atoms, manganese atoms, carbon atoms, magnesium atoms and calcium atoms each in a content of $1\times10^{17}$ atom/cm$^3$ or less, chromium atoms in a content of $1\times10^{16}$ atom/cm$^3$ or less, and chlorine atoms in a content of $1\times10^{15}$ atom/cm$^3$ or less.

2. The layer of said crystal of said nitride of said group 13 element of claim 1, wherein said high-luminance light-emitting part substantially extends along said m-plane of said crystal of said nitride of said group 13 element.

3. The layer of said crystal of said nitride of said group 13 element of claim 1, wherein a half value width of reflection at (0002) plane of an X-ray rocking curve on said upper surface is 3000 seconds or less and 20 seconds or higher.

4. The layer of said crystal of said nitride of said group 13 element of claim 1, wherein voids are not observed on a cross section substantially perpendicular to said upper surface of said layer of said crystal of said nitride of said group 13 element.

5. The layer of said crystal of said nitride of said group 13 element of claim 1, wherein a dislocation density on said upper surface of said layer of said crystal of said nitride of said group 13 element is $1\times10^6$/cm$^2$ or less.

6. The layer of said crystal of said nitride of said group 13 element of claim 5, wherein said dislocation density on said upper surface of said layer of said crystal of said nitride of said group 13 element is $1\times10^2$/cm$^2$ or higher and $1\times10^6$/cm$^2$ or less.

7. The layer of said crystal of said nitride of said group 13 element of claim 1, wherein a half value width of reflection at (1000) plane of an X-ray rocking curve on said upper surface is 10000 seconds or less and 20 seconds or higher.

8. The layer of said crystal of said nitride of said group 13 element of claim 1, wherein said nitride of said group 13 element comprises a gallium nitride series nitride.

9. A free-standing substrate comprising said layer of said crystal of said nitride of said group 13 element of claim 1.

10. A functional device comprising:
    said free-standing substrate of claim 9; and
    a functional layer provided on said layer of said crystal of said nitride of said group 13 element.

11. The functional device of claim 10, wherein said functional layer has a function of light-emitting function, rectifying function or electric power-controlling function.

12. A composite substrate comprising:
    a supporting body; and
    said layer of said crystal of said nitride of said group 13 element of claim 1 provided on said supporting body.

13. A functional device comprising:
    said composite substrate of claim 12; and
    a functional layer provided on said layer of said crystal of said nitride of said group 13 element.

14. The functional device of claim 13, wherein said functional layer has a function of light-emitting function, rectifying function or electric power-controlling function.

* * * * *